United States Patent
Min et al.

(10) Patent No.: US 7,135,207 B2
(45) Date of Patent: Nov. 14, 2006

(54) CHEMICAL VAPOR DEPOSITION METHOD USING ALCOHOL FOR FORMING METAL OXIDE THIN FILM

(75) Inventors: Yo-sep Min, Kyungki-do (KR); Young-jin Cho, Incheon (KR); Jung-hyun Lee, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 521 days.

(21) Appl. No.: 10/355,221

(22) Filed: Jan. 31, 2003

(65) Prior Publication Data

US 2003/0185981 A1 Oct. 2, 2003

(30) Foreign Application Priority Data

Apr. 2, 2002 (KR) ............... 2002-18026

(51) Int. Cl.
C23C 16/18 (2006.01)
(52) U.S. Cl. ............... 427/255.36; 427/255.23; 427/255.31
(58) Field of Classification Search ........... 427/255.35, 427/255.36
See application file for complete search history.

(56) References Cited

U.S. PATENT DOCUMENTS

| 4,058,430 | A | | 11/1977 | Suntola et al. | |
|---|---|---|---|---|---|
| 5,124,180 | A | * | 6/1992 | Proscia | 427/255.35 |
| 6,258,157 | B1 | * | 7/2001 | Gordon | 106/287.24 |
| 6,548,424 | B1 | * | 4/2003 | Putkonen | 438/785 |
| 6,660,660 | B1 | * | 12/2003 | Haukka et al. | 438/778 |
| 6,689,427 | B1 | * | 2/2004 | Min et al. | 427/592 |
| 2002/0102818 | A1 | * | 8/2002 | Sandhu et al. | 438/479 |
| 2004/0043149 | A1 | * | 3/2004 | Gordon et al. | 427/255.31 |
| 2005/0136689 | A9 | * | 6/2005 | Vaartstra | 438/785 |

FOREIGN PATENT DOCUMENTS

KR P1999-0037499 5/1999

OTHER PUBLICATIONS

Ritala, M. et al., *Atomic layer epitaxy—a valuable tool for nanotechnology?*, Nanotechnology 10 (1999) pp. 19-24.

(Continued)

*Primary Examiner*—Timothy Meeks
*Assistant Examiner*—Cachet I. Sellman
(74) *Attorney, Agent, or Firm*—Buchanan Ingersoll & Rooney PC

(57) ABSTRACT

Provided is a method for fabricating a metal oxide thin film in which a metal oxide generated by a chemical reaction between a first reactant and a second reactant is deposited on the surface of a substrate as a thin film. The method involves introducing a first reactant containing a metal-organic compound into a reaction chamber including a substrate; and introducing a second reactant containing alcohol. Direct oxidation of a substrate or a deposition surface is suppressed by a reactant gas during the deposition process, as it uses alcohol vapor including no radical oxygen as a reactant gas for the deposition of a thin film. Also, since the thin film is deposited by the thermal decomposition, which is caused by the chemical reaction between the alcohol vapor and a precursor, the deposition rate is fast. Particularly, the deposition rate is also fast when a metal-organic complex with β-diketone ligands is used as a precursor. Further, a thin film with low leakage current can be obtained as the metal oxide thin film fabrication method using a chemical vapor deposition or atomic layer deposition method grows a thin film with fine microstructure.

9 Claims, 4 Drawing Sheets

OTHER PUBLICATIONS

Rees, Jr., W. et al., *Group IIA β-Diketonate Compounds as CVD-Precursors for High-$T_c$ Superconductors*, Materials Science Forum vol. 137-139 (1993), pp. 473-494.

Min, B. et al., *Liquid Source-MOCVD of $Ba_xSr_{1-x}TiO_2$ (BST) Thin Films with a N-alkoxy-β-ketiominato Titanium Complex*, Chem. Vap. Deposition 2001, vol. 7, No. 4, pp. 146-149.

Park, K. et al., *Low Temperature Metal-Organic Chemical Vapor Deposition of Ru Thin Films as Electrode for High Dielectric Capacitors*, Integrated Ferroelectrics, 2000, vol. 30, pp. 45-52.

Joo, J. et al., *Investigation of Ruthenium Electrodes for $(Ba,Sr)TiO_3$ Thin Films*, Jpn. J. Appl. Phys. vol. 37 (1998), pp. 3396-3401.

Gordon, R. et al., *Vapor Deposition of Metal Oxides and Silicates: Possible Gate Insulators for Future Microelectrics*, Chem. Mater. 2001, 13, pp. 2463-2464.

Niinisto, L. et al., *Synthesis of oxide thin films and overlayers by atomic layer epitaxy for advanced applications*, Materials Science and Engineering B41 (1996), pp. 23-29.

Ritala, M. et al., *Atomic Layer Deposition of Oxide Thin Films with Metal Alkoxides as Oxygen Sources*, Science, vol. 288, 2000, pp. 319-321.

Seim, H. et al., *Deposition of $LaNio_2$ thin films in an atomic layer epitaxy reactor*, J. Mater. Chem., 1997, 7(3), pp. 449-454.

Notice to Submit Response, by the Korean Patent Office on Apr. 30, 2004, Application No. 10-2002-0018026

\* cited by examiner

CHEMICAL VAPOR DEPOSITION METHOD USING ALCOHOL FOR FORMING METAL OXIDE THIN FILM

BACKGROUND OF THE INVENTION

This application claims the priority of Korean Patent Application No. 2002-18026, filed Apr. 2, 2002, in the Korean Intellectual Property Office, the disclosure of which is incorporated herein in its entirety by reference.

1. Field of the Invention

The present invention relates to a method for fabricating a metal oxide thin film by using a chemical vapor deposition method or atomic layer deposition method, and more particularly, to a method for fabricating a metal oxide thin film by using a chemical vapor deposition method or an atomic layer deposition method which uses alcohol vapor as a reactant gas.

2. Description of the Related Art

A chemical vapor deposition method is widely used for forming oxides, nitrides and sulfides of a metal, and metallic thin films. It is also used for forming a polymer or organic thin film. Since thin films fabricated by the chemical vapor deposition method have a characteristic of uniform step coverage in a three-dimensional structure, the chemical vapor deposition is extensively used as a fabrication method of highly integrated devices, particularly, in the semiconductor field.

Also, researchers are actively studying on an atomic layer deposition method, which is an advanced form of the chemical vapor deposition, for fabrication of ultra-thin films because perfect step coverage can be obtained from the method, even though there is a shortcoming of slow deposition rate [Nanotechnology 10, pp. 19–24, 1999; and U.S. Pat. No. 4,058,430].

In general, multi-component oxide films, such as BST, STO and PZT, are fabricated by decomposing a precursor in the form of a metal-organic compound comprising metal ions and ligands. The most popular ligands are of β-diketone group [Materials Science Forum Vol. 137–139, pp.473–494, 1993]. As for reactant gases to decompose them, oxygen-containing gases such as oxygen ($O_2$) and ozone have been mostly used [Chem. Vap. Deposition 7, pp.146–149, 2001; and Integrated Ferroelectrics 30, pp.45–52, 2000]

However, the oxygen-containing gases have a shortcoming of forming a second oxide layer, because they oxidize the deposition surface as well as the precursor. For example, when an oxide film is formed on silicon, which is quick to be oxidized, by using an oxygen-containing gas, a second oxide film is formed between the silicon and the oxide film [Jpn. J. Appl. Phys. 37, pp.3396–3401, 1998; and Chem. Mater. 13, pp.2463–2464, 2001].

Recently, many researchers are studying on the atomic layer deposition of a metal oxide film by using a metal-organic precursor. Here, $H_2O$, which is usually used in this process, hinders a process control, because once $H_2O$ is adsorbed into vacuum equipment during process, it is hardly removed [Materials Science and Engineering B41, pp.23–29, 1996].

Besides, since the atomic layer deposition is a method that forms a thin film by the surface reaction between the precursors adsorbed on the surface and the reactant gas, precursors with high reactivity, such as cyclopentadienyl group, alkoxide group or halide group are required necessarily [Science 288, pp.319–321, 2000].

However, as those precursors with high reactivity have a low chemical and thermal stability, it is difficult to secure reproductivity and reliability in the deposition process. On the other hand, precursors of β-diketone group have a relatively excellent chemical, thermal stability, but too low reactivity to be used in the atomic layer deposition. Thus, in order to activate surface reaction, deposition temperature should be raised, or gases with high reactivity such as ozone should be used. Otherwise, plasma-enhanced atomic layer deposition (PEALD) method using plasma should be used [J. Mater. Chem. 7, pp.449–454, 1997; and Korean patent application laid-open publication No. 2000-0049298].

SUMMARY OF THE INVENTION

To solve the above-described problems, it is an object of the present invention to provide a method for fabricating a metal oxide thin film by using a chemical vapor deposition (CVD) method that can suppress the formation of a second oxide film on a substrate or a deposition surface.

It is another object of the present invention to provide a method for fabricating a metal oxide thin film by using an atomic layer deposition (ALD) method without using $H_2O$, since $H_2O$ principally used in the atomic layer deposition method is adsorbed in vacuum equipment during process and then hardly removed, thus hindering a process control.

It is still another object of the present invention to provide a method for fabricating a metal oxide thin film by using a chemical vapor deposition or atomic layer deposition method that uses metal oxide precursors of β-diketone group, which has an excellent chemical, thermal stability and makes easy to secure reproductivity and reliability of the process.

To achieve the technological objects, there is provided a method for fabricating a metal oxide thin film, comprising the steps of: introducing the first reactant containing a metal-organic compound to a reaction chamber including a substrate; and introducing the second reactant containing alcohol, whereby a metal oxide generated by the chemical reaction between a first reactant and a second reactant is deposited on the surface of a substrate as a thin film.

Preferably, the alcohol is of at least one material selected from the group consisting of alcohol having 1 to 8 carbon atoms. The alcohol may be evaporated before it goes into the reaction chamber.

Also, the second reactant may be supplied to the reaction chamber including a substrate together with one or more gases selected from the group consisting of $O_2$, $N_2O$, $O_3$ and $H_2O$.

It is preferable that the metal-organic compound is a metal-organic complex with β-diketone ligands. For example, the metal-organic complex with β-diketone ligands may be selected from the group consisting of metal-organic precursors having at least one β-diketone ligand, such as $Ti(mpd)(thd)_2$, where 'mpd' indicates 2-methyl-2,4-pentanedioxy; and 'thd' indicates 2,2,6,6-tetramethyl-3,5-heptanedionate), or $Ti(thd)_2(OiPr)_2$, where 'OiPr' indicates iso-propoxide.

Accordingly, the metal oxide thin film that can be obtained by the metal oxide thin film fabrication method may be selected from the group consisting of $Al_2O_3$, $TiO_2$, $ZrO_2$, $HfO_2$, $Ta_2O_5$, $Nb_2O_5$, $CeO_2$, $Y_2O_3$, $SiO_2$, $In_2O_3$, $RuO_2$, $IrO_2$, $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, $(Ba,Sr)RuO_3$, $In_2O_3$ doped with Sn (ITO), and $In_2O_3$ doped with Zr.

The first reactant and the second reactant may be introduced to the reaction chamber simultaneously. Also, the first reactant and the second reactant are introduced to the reaction chamber in different time periods separately.

A time period for purging the reaction chamber with an inert gas may be further included between the time period for the first reactant and the time period for the second reactant.

To implement an atomic layer deposition method in the above described method, it is preferable to include the steps of: introducing the first reactant to the reaction chamber and chemisorbing the first reactant to the surface of the substrate; purging the reaction chamber with an inert gas and removing the physisorbed or remaining first reactant; substituting the chemisorbed first reactant into a metal-oxygen atomic layer by introducing the second reactant to the reaction chamber and reacting the second reactant with the chemisorbed first reactant; and purging the reaction chamber with an inert gas and removing gas produced after the reaction and the physisorbed or remaining second reactant.

The thickness of the thin film may be grown by repeating the metal oxide thin film fabrication method a number of times.

The metal oxide thin film fabrication method of the present invention provides metal oxide thin films having a fine microstructure and thus an excellent leakage current characteristic.

BRIEF DESCRIPTION OF THE DRAWINGS

The above objects and advantages of the present invention will become more apparent by describing preferred embodiments thereof in detail with reference to the attached drawings in which.

DETAILED DESCRIPTION OF THE INVENTION

Figure 1:
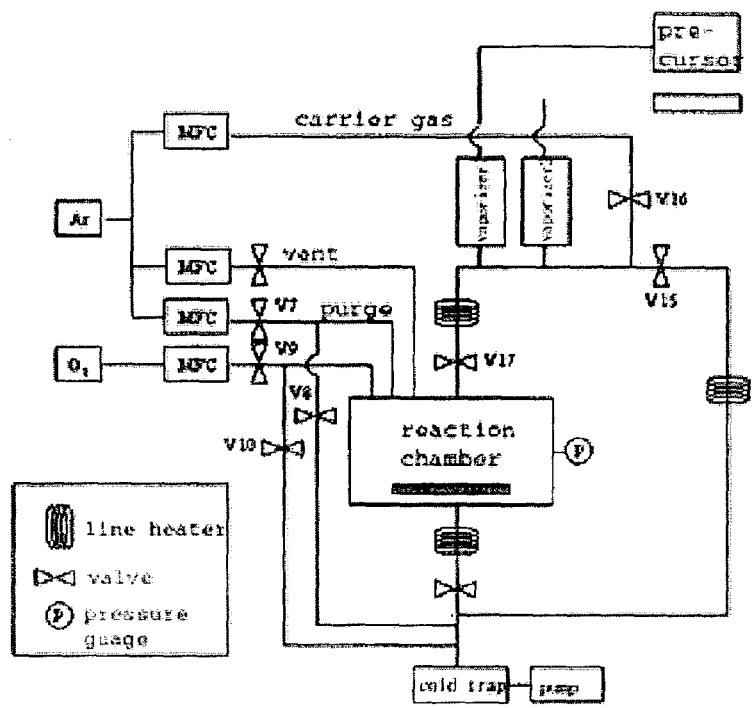
FIG. 1 is a schematic diagram showing an apparatus used in the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. The same reference numerals in different drawings represent the same element, and thus their description will be omitted.

Reacting with a metal-organic compound, which is a precursor of a metal oxide thin film, a second reactant forms a metal oxide thin film. Since the present invention uses a second reactant containing alcohol which is free from radical oxygen, unlike oxygen and ozone, it is possible to suppress direct oxidation of a substrate or deposition surface by a reactant gas during deposition process. For example, in a growth experiment of a $TiO_2$ thin film fabricated by using an apparatus of FIG. 1, the thickness of a native oxide film of the thin film is about 20 Å in case of using oxygen and about 17 Å in case of iso-propyl alcohol (IPA), which indicates that the oxidation of the substrate has been suppressed in the early stage of deposition.

Figure 2:
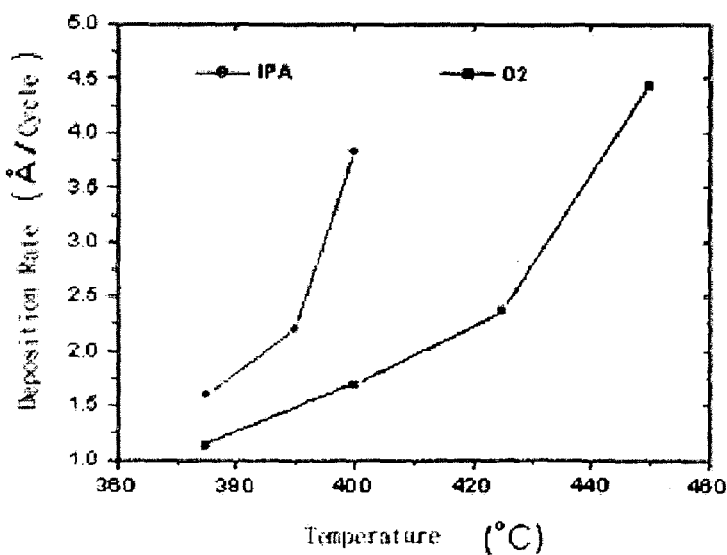
FIG. 2 is a graphical view representing the deposition rate of a $TiO_2$ thin film deposited by using oxygen or iso-propyl alcohol (IPA) when temperature varies.

Also, the deposition is carried out fast because the thin film is deposited as a result of the thermal decomposition by a chemical reaction between the alcohol and the precursor. Accordingly, it is easy to perform atomic layer deposition that uses a precursor having β-diketone ligands in spite of its relatively low reactivity. For example, in a growth experiment of the $TiO_2$ thin film fabricated by using an apparatus of FIG. 1, the deposition rate of the thin film deposition by using IPA as illustrated in FIG. 2 is faster than that of using oxygen.

In the method of fabricating a metal oxide thin film using a chemical vapor deposition or atomic layer deposition method in accordance with the present invention, a thin film with a superb leakage current property can be obtained because a thin film with a fine microstructure is grown.

In this invention, it is preferable to use alcohols having 1–8 carbon atoms, such as methanol, ethanol, propanol, butanol, or isopropyl alcohol, to decompose the precursor material.

Since the alcohol is in a liquid state at room temperature under atmospheric pressure, it is preferable to evaporate alcohol in the form of vapor and supply the evaporated alcohol to a reaction chamber. As to the methods for evaporating alcohol, there are, for example, a bubbler method in which a carrier gas is flown to the alcohol stored in a bubbler heated up to an appropriate temperature and evaporates the alcohol; and an evaporator method in which alcohol is dropped or jet-injected onto a thermal plate heated up to an appropriate temperature and performs flash evaporation.

In case where it's not significant whether an underside film is oxidized, the second reactant can be used together with one or more gases selected from the group consisting of $O_2$, $N_2O$, $O_3$ and $H_2O$, as well as alcohol.

In the present invention, metal-organic compounds having a cyclopentadienyl group, alkoxide group, or halide group, besides β-diketone group, can be included in the first reactant as a precursor of a metal oxide. Preferably used are metal-organic complex with β-diketone ligand, securing reproductivity and reliability in the thin film fabrication process with excellent chemical, thermal stability.

By using the metal-organic compounds with the diketone ligand, the metal oxide thin film fabrication method of the present invention using a chemical vapor deposition or atomic layer deposition method can be used to fabricate a metal oxide thin film selected from the group consisting of $Al_2O_3$, $TiO_2$, $ZrO_2$, $HfO_2$, $Ta_2O_5$, $Nb_2O_5$, $CeO_2$, $Y_2O_3$, $SiO_2$, $In_2O_3$, $RuO_2$, $IrO_2$, $SrTiO_3$, $PbTiO_3$, $SrRuO_3$, CaRuO$_3$, (Ba,Sr)TiO$_3$, Pb(Zr,Ti)O$_3$, (Pb,La)(Zr,Ti)O$_3$, (Sr, Ca)RuO$_3$, (Ba,Sr)RuO$_3$, In$_2$O$_3$ doped with Sn, and In$_2$O$_3$ doped with Zr.

The second reactant containing alcohol to oxidize the metal-organic compound and the first reactant including the metal-organic compound, which is a precursor of the metal oxide, includes an inert gas as a carrier gas. Nitrogen, argon, etc. can be used as the inert gas.

Each of the above reactants is introduced to the reaction chamber through an additional line attached thereto. The reactants can be introduced in various modes of order as described below.

The first reactant and the alcohol-containing second reactant can be introduced into the reaction chamber simultaneously.

Also, the first reactant and the alcohol-containing second reactant can be introduced to the reaction chamber in different time periods separately.

Also, a time period for purging the reaction chamber with an inert gas can be included between the time period for the first reactant and the time period for the second reactant.

Also, to implement the present invention in the atomic layer deposition method, it is preferable to include the steps of introducing the first reactant into the reaction chamber and chemically adsorbing the first reactant on the surface of the substrate; purging the reaction chamber with an inert gas and removing the physically adsorbed or remaining first reactant; substituting the chemically adsorbed first reactant by a metal-oxygen atomic layer by introducing the alcohol-containing second reactant to the reaction chamber and reacting it with the chemically adsorbed first reactant; and purging the reaction chamber with an inert gas and removing gas produced after the reaction and the physically adsorbed or remaining second reactant. Also, a metal oxide thin film of a desired thickness can be formed on the substrate by repeating the above process as many as needed.

Figure 6:
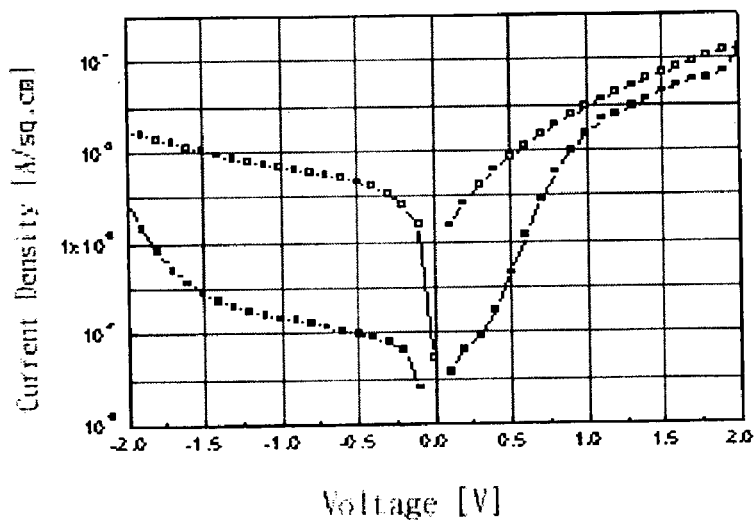
FIG. 6 is a graphical view illustrating leakage current characteristics of a $TiO_2$ capacitor, in which white symbols show a leakage current density in a deposition using oxygen, while black symbols show that of deposition using IPA in accordance with an applied voltage.

Since the metal oxide thin film deposited using the method of the present invention has a fine microstructure, leakage current is greatly lowered. This invention uses alcohol vapor that does not have radical oxygen such as oxygen, ozone, etc., as a reactant gas for oxidizing the precursor. Because the thin film is deposited from thermal decomposition by chemical reaction between the alcohol and the precursor, the deposition rate become fast and the microstructure of the thin film becomes very fine. In fact, as shown in the high resolution transmission electron microscopy (HRTEM) images of FIGS. 4A to 4C, the thin film using oxygen as a reactant gas shows a columnar growth, but in case of using alcohol instead, the film can grow finely and shows a further excellent leakage current characteristic, as shown in FIG. 6, when a capacitor is made of it. Also, from the HRTEM lattice images of FIGS. 4A to 4C, it can be noticed that bigger grains have been formed in a deposition using alcohol vapor. In Auger depth profile for figuring out the amount of carbon remaining in the thin film, the level of remaining carbon is similar in oxygen and alcohol vapor environments.

The present invention will be described in detail with reference to preferred embodiments hereinbelow. However, the scope of this invention is not limited to the following embodiments.

COMPARATIVE EXAMPLE 1

Deposition of TiO$_2$ by Using Oxygen as a Reactant Gas

A first reactant was 0.1 M of a solution in which Ti(mpd)(thd)$_2$, which is a Ti precursor with a diketone ligand, was resolved in n-butyl acetate, and a second reactant was oxygen. The apparatus of FIG. 1 was operated in an ALD mode, and the deposition temperature was 375–450° C. and the pressure of the reaction chamber was about 1 Torr (the pressure may vary according to the deposition temperature). A cycle of deposition was performed as follows. First, the reaction chamber was purged with 300 sccm of argon for two seconds. Then the first reactant was introduced into the reaction chamber with argon used as a carrier gas. Here, argon was flowed at a rate of 150 sccm for 0.5 seconds. In the next step, the reaction chamber was purged with 300 sccm of argon for one second, and the second reactant (oxygen) was introduced into the reaction chamber. Here, oxygen was flowed at a rate of 50 sccm for one second. The operation of each valve and evaporation injector in each step was as shown in Table. 1.

TABLE 1

|  | V7 | V8 | V9 | V10 | V15 | V16 | V17 | Evaporator 1 | Evaporator 2 |
|---|---|---|---|---|---|---|---|---|---|
| Purge | O | X | X | O | O | O | X | X | X |
| First Reactant | X | O | X | O | X | O | O | O | X |
| Purge | O | X | X | O | O | O | X | X | X |
| Second Reactant (Oxygen) | X | O | O | X | O | O | X | X | X |

(O: open, X: closed)

The above described deposition cycle was repeated 300 times. The thickness of the deposited thin film was determined from sectional scanning electron microscope (SEM) photographs. Under the above process conditions, the deposition rate of the TiO$_2$ thin film according to temperature was shown in FIG. 2.

Although the deposition experiment was performed in an ALD mode, high deposition temperature causes a CVD phenomenon, in which the deposition rate increases as the deposition temperature goes up. It can be seen from FIG. 3, which shows an X-ray diffraction pattern of the thin film deposited using the above method, that TiO$_2$ in an anatase phase has been formed since the thin film was deposited at a relatively low temperature.

EXAMPLE 1

Deposition of TiO$_2$ by Using IPA as a Reactant Gas

A first reactant was 0.1 M of a solution in which Ti(mpd)(thd)$_2$, which is a Ti precursor with a diketone ligand, was resolved in n-butyl acetate, and a second reactant was IPA. The apparatus of FIG. 1 was operated in the ALD mode, and the deposition temperature was 375–400° C. and the reaction chamber pressure was about 1 Torr (the pressure may vary according to the deposition temperature). A cycle of deposition was performed as follows. First, the reaction chamber was purged with 300 sccm of argon for two seconds. Then the first reactant was introduced into the reaction chamber with argon used as a carrier gas. Here, argon was flowed at a rate of 150 sccm for 0.5 seconds. In the next step, the reaction chamber was purged with 300 sccm of argon for one second, and the second reactant (IPA) was introduced into the reaction chamber by using argon as a carrier gas. Here, argon was flowed at a rate of 150 sccm for 0.5 seconds. The operation of each valve and evaporation injector in each step is shown in Table. 2.

TABLE 2

| | V7 | V8 | V9 | V10 | V15 | V16 | V17 | Evaporator 1 | Evaporator 2 |
|---|---|---|---|---|---|---|---|---|---|
| Purge | O | X | X | O | O | O | X | X | X |
| First Reactant | X | O | X | O | X | O | O | O | X |
| Purge | O | X | X | O | O | O | X | X | X |
| Second Reactant (IPA) | X | O | X | X | X | O | O | X | O |

(O: open, X: closed)

The above deposition cycle was repeated 300 times. The thickness of the deposited thin film was determined from sectional SEM photographs. Under the above process conditions, the deposition rate of $TiO_2$ thin film according to temperature is as shown in FIG. 2. Compared with a case of using oxygen, when vapor of IPA is used as a reactant gas, the deposition rate increased at each temperature, greatly as the temperature is increased.

Figure 3:
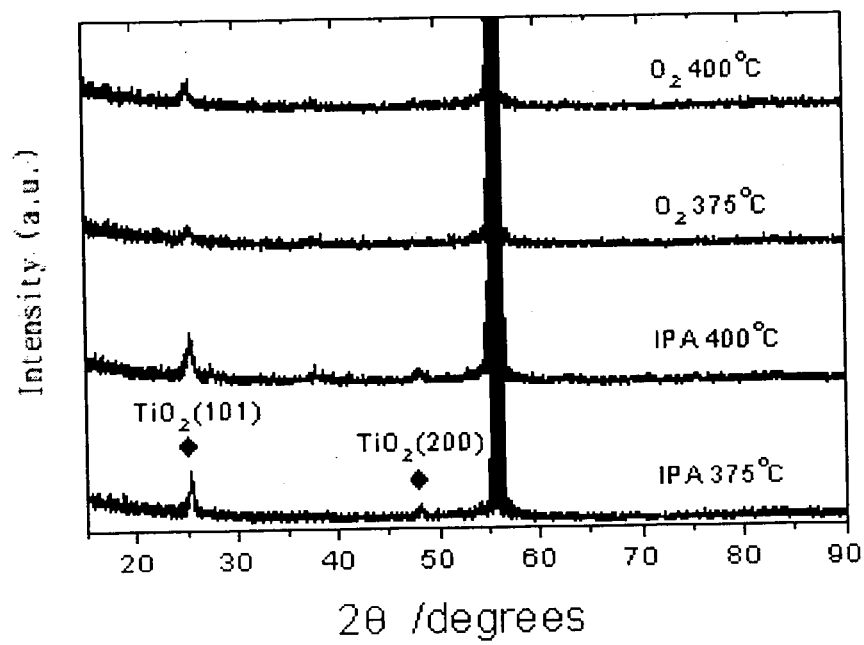
FIG. 3 is an X-ray diffraction pattern of the $TiO_2$ thin film deposited by using oxygen or iso-propyl alcohol (IPA) at each deposition temperature.
Figure 4A:
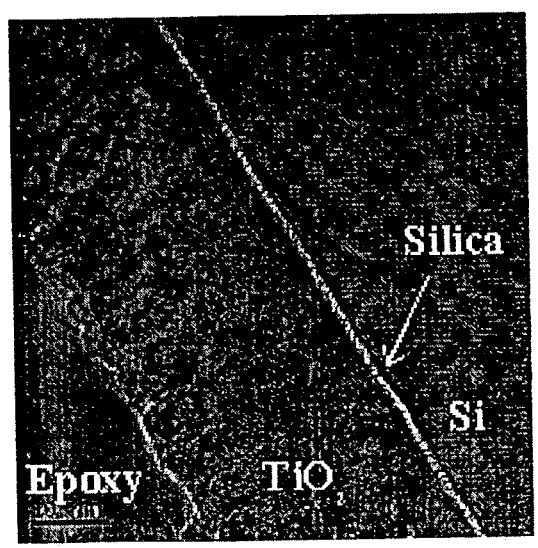
FIGS. 4A to 4C are high resolution transmission electron microscopy (HRTEM) images of the deposited $TiO_2$ thin film, FIG. 4A representing a case of using oxygen in the deposition process while FIGS. 4B and 4C, using IPA.
Figure 4B:
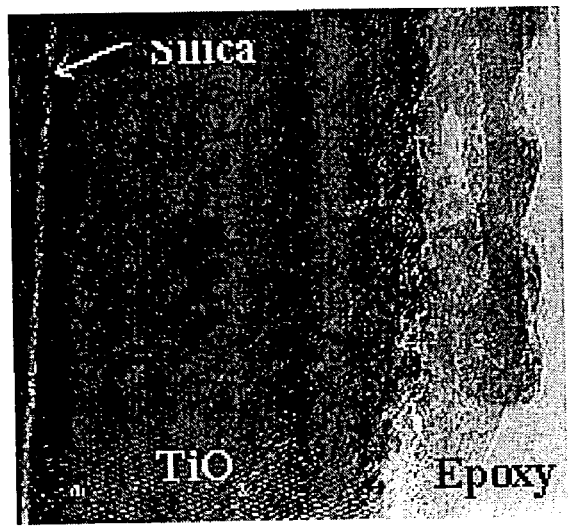
Figure 4C:
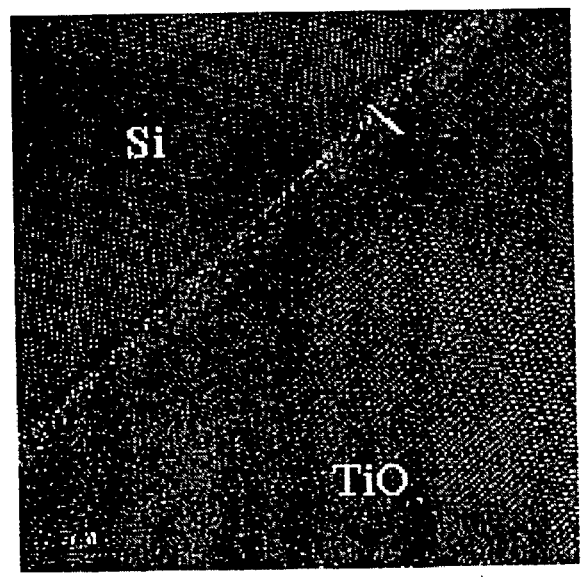
Figure 5:
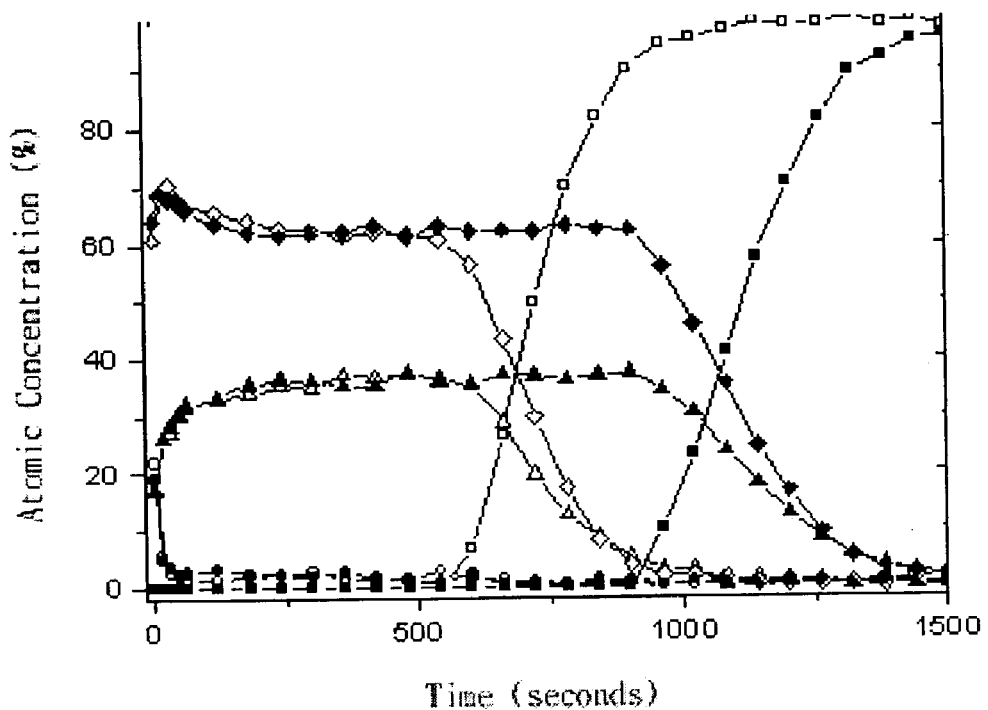
FIG. 5 is a graphical view representing the result of Auger spectroscopy depth analysis of the deposited $TiO_2$ thin film, where white symbols show deposition using oxygen while black symbols show deposition using IPA, in both of which the marks of triangle, diamond, square and circlet denote titanium, oxygen, silicon and carbon, respectively.

FIG. 3, which is an X-ray diffraction pattern of the thin film deposited in the above-described method, shows the formation of $TiO_2$ in an anatase phase, because the thin film was deposited at 400° C. and less. FIG. 4A is a HRTEM photograph of a thin film deposited at 375° C. by using oxygen, while FIGS. 4B and 4C are photographs of those deposited at 375° C. by using IPA. They show the grains of the $TiO_2$ thin film deposited by using IPA are bigger than those of the thin film deposited by using oxygen, and the $TiO_2$ thin film deposited by using IPA is grown by the growth of the grains. Also, from the Auger depth profile of FIG. 5, it can be seen that the amount of the remaining carbon in the thin film when IPA is used as a reactant gas was almost the same as when when oxygen is used.

EXAMPLE 2

Fabrication of $TiO_2$ Capacitor and Electrical Characteristic Thereof

To appraise the electrical characteristics of the deposited $TiO_2$ thin film, 100 cycles of deposition by using oxygen was performed to form a 600 Å of a $TiO_2$ thin film; and 70 cycles of deposition by using IPA, to obtain 700 Å of $TiO_2$ thin film on an $Al_2O_3$ (7 Å)/Ru(1000 Å)/Si wafer at 470° C. in the same process of Comparative Example 1 and Embodiment 1, respectively. Then, a $TiO_2$ capacitor was fabricated by carrying out DC magnetron sputtering and forming a Ru top electrode (700 Å). FIG. 6, which illustrates the electrical characteristics of each capacitor, shows that the leakage current of the $TiO_2$ thin film deposited by using IPA is small. The reason seems in the fact that the $TiO_2$ thin film deposited by oxygen makes a columnar growth while that of using IPA makes a granular growth, thus forming less leakage paths than the columnar structure, as seen in FIG. 4.

The present invention suppresses the direct oxidation of a substrate or a deposition surface by a reactant gas during the deposition process, as it uses alcohol vapor including no radical oxygen as a reactant gas for the deposition of a thin film. Also, being deposited by the thermal decomposition by the chemical reaction between the alcohol vapor and the precursor, the deposition rate is fast. Particularly, the deposition rate is also fast when a metal-organic compound with a β-diketone ligand is used as a precursor. Further, a thin film with a low leakage current can be obtained, as the metal oxide thin film fabrication method of the present invention using a chemical vapor deposition or atomic layer deposition method grows a thin film with fine microstructure.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for fabricating a titanium oxide thin film, comprising:
    introducing a first reactant containing a titanium metal-organic complex with at least one diketone ligand selected from the group consisting of Ti(mpd)(thd)$_2$ and Ti(thd)$_2$(OiPr)$_2$ into a reaction chamber including a substrate;
    introducing a second reactant containing alcohol; and
    wherein the titanium oxide in the anatase phase is generated by a chemical reaction between the first reactant and the second reactant and is deposited on the surface of the substrate as a thin film.

2. The method of claim 1, wherein the alcohol is of at least one selected from the group consisting of alcohol having 1 to 8 carbon atoms.

3. The method of claim 1, wherein the alcohol is evaporated before it is introduced into the reaction chamber.

4. The method of claim 1, wherein the titanium metal-organic complex with a β-diketone ligand is Ti(mpd)(thd)$_2$.

5. The method of claim 1, wherein the titanium metal-organic complex with the β-diketone ligand is Ti(thd)$_2$(OiPr)$_2$.

6. The method of claim 1, wherein the first reactant and the second reactant are introduced into the reaction chamber simultaneously.

7. The method of claim 1, wherein the first reactant and the second reactant are introduced into the reaction chamber at different time periods separately.

8. The method of claim 7, further including a time period for purging the reaction chamber with an inert gas between the time period for supplying the first reactant into the reaction chamber and the time period for supplying the second reactant into the reaction chamber.

9. The method of claim 8, comprising the steps of:
    introducing the first reactant into the reaction chamber and chemically adsorbing the first reactant on the surface of the substrate;
    purging the reaction chamber with an inert gas and removing the physically adsorbed or remaining first reactant;
    substituting the chemically adsorbed first reactant into a titanium metal-oxygen atomic layer by introducing the second reactant into the reaction chamber and reacting the second reactant with the chemically adsorbed first reactant; and
    purging the reaction chamber with an inert gas and removing gas produced after the reaction and the physically adsorbed or remaining second reactant.

* * * * *